United States Patent
Greeley

(10) Patent No.: US 7,180,009 B2
(45) Date of Patent: Feb. 20, 2007

(54) TRANSMISSION LINE WITH STRIPPED SEMI-RIGID CABLE

(75) Inventor: John S Greeley, Ambler, PA (US)

(73) Assignee: BAE Systems Information and Electronic Systems Inteegration Inc., Nashua, NH (US)

( * ) Notice: Subject to any disclaimer, the term of this patent is extended or adjusted under 35 U.S.C. 154(b) by 395 days.

(21) Appl. No.: 10/903,535

(22) Filed: Jul. 30, 2004

(65) Prior Publication Data

US 2006/0022775 A1   Feb. 2, 2006

(51) Int. Cl.
*H01R 12/04*  (2006.01)
*H05K 1/11*  (2006.01)

(52) U.S. Cl. .............. 174/265; 174/266; 174/262

(58) Field of Classification Search ........... 174/265, 174/266, 262; 439/63
See application file for complete search history.

(56) References Cited

U.S. PATENT DOCUMENTS

| | | | |
|---|---|---|---|
| 5,123,863 A | 6/1992 | Frederick et al. | |
| 5,190,054 A | 3/1993 | Fetter et al. | |
| 6,007,347 A | 12/1999 | Keldsen et al. | |
| 6,325,796 B1 | 12/2001 | Berube et al. | |
| 6,366,254 B1 | 4/2002 | Sievenpiper et al. | |
| 6,515,632 B1 | 2/2003 | McLean | |
| 6,575,762 B2 * | 6/2003 | Evans | 439/63 |
| 2001/0029368 A1 | 10/2001 | Berube | |
| 2002/0156588 A1 | 10/2002 | Arndt et al. | |
| 2002/0177332 A1 | 11/2002 | Hubbard et al. | |
| 2003/0065317 A1 | 4/2003 | Rudie et al. | |
| 2003/0222738 A1 | 12/2003 | Brown et al. | |
| 2004/0090238 A1 | 5/2004 | Hayden et al. | |
| 2004/0095156 A1 | 5/2004 | Hayden et al. | |

\* cited by examiner

*Primary Examiner*—Dean A. Reichard
*Assistant Examiner*—Ivan Carpio
(74) *Attorney, Agent, or Firm*—Maine & Asmus

(57) ABSTRACT

A high frequency coax transmission line structure is configured with a stripped semi-rigid cable (no shield). The stripped cable is inserted lengthwise into a metallized grounded slot formed in a printed wiring board. The dielectric barrel of the stripped cable contacts each of the elongated side and bottom walls of the slot. An exposed portion of center conductor at each end of the cable lays tangent on a corresponding one of connection points (at each end of the slot). The structure reduces loss for long transmission line lengths, and fixes the mounting depth and routing for a consistent transition. Inductive compensation can be provided at the connections point at each end of the slot to mitigate transition discontinuity.

20 Claims, 3 Drawing Sheets

TRANSMISSION LINE WITH STRIPPED SEMI-RIGID CABLE

STATEMENT OF GOVERNMENT INTEREST

Portions of the present invention may have been made in conjunction with Government Funding, and there may be certain rights to the U.S. Government.

RELATED APPLICATIONS

This application is related to U.S. application Ser. No. 10/903,566, filed Jul. 30, 2004, titled "High Frequency Via", and to U.S. application Ser. No. 10/903,534, filed Jul. 30, 2004, titled "High Frequency Via with Stripped Semi-Rigid Cable". Each of these applications is herein incorporated in its entirety by reference.

FIELD OF THE INVENTION

The invention relates to high frequency printed wiring boards, and more particularly, to a high frequency coax transmission line structure.

BACKGROUND OF THE INVENTION

Microwave signals are transmitted from point-to-point by waveguides or antennas. The main difference between the two is that an antenna radiates the electromagnetic field into open space, while a waveguide confines the electromagnetic field to an area along the signal path. There are a number of conventional waveguide sub-categories.

A transmission line is one such sub-category. It uses some physical configuration of metal and/or dielectrics to direct a signal along the desired path. Typical transmission lines use two conductors—a signal and ground. There are also single conductor transmission lines, such as rectangular waveguides. The simplest type of transmission line configuration is coaxial line. Stripline is essentially a flattened version of the coaxial line configuration. Microstrip line simplifies the stripline configuration, by removing the upper ground planes.

Microstrip line is generally the most commonly used means for planar transmission line applications, because it is highly manufacturable and eases circuit connections and signal probing. Its disadvantage over stripline is that some of the energy transmitted may couple to adjacent traces or into space. Unlike microwave antennas, microwave waveguides are not intended to radiate energy in this way, which causes signal loss and interference. A coplanar waveguide with ground (CPWG) is essentially a low radiation version of microstrip.

In any case, as a microwave signal travels down the signal path of a waveguide, it is subjected to various characteristics associated with that path, such as path discontinuity when transitioning from one path-type (e.g., microstrip line) to another (e.g., component pin). Signal loss is another such characteristic, particularly for long transmission paths. Such characteristics generally impact on the waveguides performance, and must be taken into account.

For example, consider the case where a microwave signal must travel a significant distance on a printed wiring board. This passing of the signal from one point to another is typically achieved with conventional transmission lines, such as stripline, microstrip line, or CPWG transmission lines. The outer conductor or shield of these transmission lines is usually connected to the ground plane.

However, due to their construction, such transmission lines are typically associated with a high and non-uniform current densities in their signal conductors. Generally stated, a non-uniform current distribution across a cross-section of the surface of the center conductor of a transmission line makes for resistive signal conductor losses, and is a dominant loss mechanism. In addition, conventional transmission lines are typically associated with significant manufacturing variability inherent in their assembly process, which further contributes to the poor transition control and discontinuity.

What is needed, therefore, is an improved coax transmission line structure for efficiently carrying and transitioning high frequency signals on a printed wiring board.

SUMMARY OF THE INVENTION

One embodiment of the present invention provides a printed wiring board that includes a high frequency coax transmission line structure. The board includes a slot formed in the board. The slot has elongated side and bottom walls that are metallized and grounded. There is a printed connection point at each end of the slot. A semi-rigid cable (e.g., UT-47, 35 ohm) stripped of its outer conductor is inserted into the slot, so that a dielectric barrel of the stripped cable contacts each of the elongated side and bottom walls. An exposed portion of center conductor at each end of the cable lays tangent on a corresponding one of the connection points. These portions of center conductor that lay tangent on each corresponding connection point can be secured in place with a bonding material, such as solder.

Note that the center conductor can be formed as necessary at the ends to lay tangent to the connection points. In one particular embodiment, the slot has a depth, such that the center conductor is bent upward to lay tangent on each corresponding connection point (i.e., the slot depth is slightly deeper than what is necessary to make the center conductor lay naturally tangent on the connection points).

The semi-rigid cable can have an impedance that is different than the impedance of the transmission line structure. For instance, the impedance of the cable can be 35 ohms, and the impedance of the structure about 47 to 53 ohms. In this sense, the stripped semi-rigid coax cable operates in conjunction with the grounded metallized slot to provide a desired line impedance. The board can further be configured to compensate for transition discontinuity at each connection point. In one such embodiment, one or both printed connection points includes a transmission line having an inductive section configured to compensate for transition discontinuity between the center conductor and the corresponding connection point. In another such embodiment, the center conductor is shaped into an inductive compensation loop at one or both ends, where each loop is configured to compensate for transition discontinuity between the center conductor and the corresponding connection point.

The board may further include a grounded metallic cover that is placed over at least a portion of the dielectric barrel extending above the slot. The printed wiring board can have, for example, top and bottom surfaces and include multiple layers therebetween, where the slot of the high frequency coax transmission line structure passes through one or more of the layers.

Another embodiment of the present invention provides a method for manufacturing a printed wiring board that includes a high frequency coax transmission line structure. The method includes fabricating a printed wiring board that includes a slot formed in the board. The slot has elongated side and bottom walls that are metallized and grounded, with a printed connection point at each end of the slot. The method continues with inserting a semi-rigid cable (e.g., UT-47, 35 ohm) stripped of its outer conductor into the slot, so that a dielectric barrel of the stripped cable contacts each of the elongated side and bottom walls, and an exposed portion of center conductor at each end of the cable lays tangent on a corresponding one of the connection points. As previously explained, the center conductor can be formed as necessary at the ends to lay tangent to the connection points. In one such case, the slot has a depth such that the center conductor is bent upward to lay tangent on each corresponding connection point. Note that the semi-rigid cable can have an impedance that is less than or otherwise different than the impedance of the transmission line structure.

The method may further include fabricating the printed wiring board to include compensation for transition discontinuity at one or both connection points. In one such embodiment, the method includes fabricating the printed wiring board so that one or both printed connection points includes a transmission line having an inductive section configured to compensate for transition discontinuity between the center conductor and the corresponding connection point. In another such embodiment, the method includes shaping the center conductor into an inductive compensation loop at one or both ends of the cable, where each loop is configured to compensate for transition discontinuity between the center conductor and the corresponding connection point. The method may further include placing a grounded metallic cover over at least a portion of the dielectric barrel extending above the slot.

Another embodiment of the present invention provides a high frequency coax transmission line structure for a printed wiring board. The transmission line structure includes a slot formed in a multilayer printed wiring board. The slot has elongated side and bottom walls that are metallized and grounded, with a printed connection point at each end of the slot. A semi-rigid cable (e.g., UT-47, 35 ohm) stripped of its outer conductor is inserted into the slot, so that a dielectric barrel of the stripped cable contacts each of the elongated side and bottom walls, and an exposed portion of center conductor at each end of the cable lays tangent on a corresponding one of the connection points. As previously explained, the center conductor can be bent or formed as necessary at the ends to lay tangent to the connection points. In one such case, the slot has a depth such that the center conductor is bent upward to lay tangent on each corresponding connection point. Inductive compensation for mitigating transition discontinuity can be provided at one or both connection points.

In one particular embodiment, inductive compensation provided at one or both printed connection points includes a transmission line having an inductive section configured to compensate for transition discontinuity between the center conductor and the corresponding connection point. In another particular embodiment, the inductive compensation is provided by the center conductor, which is shaped into an inductive compensation loop at one or both ends, where each loop is configured to compensate for transition discontinuity between the center conductor and the corresponding connection point. The dielectric barrel can be, for example, Teflon or another suitable dielectric material with a low coefficient of friction. The semi-rigid cable can have impedance that is less than impedance of the transmission line structure. However, care should be taken as previously explained.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

Figure 1A:
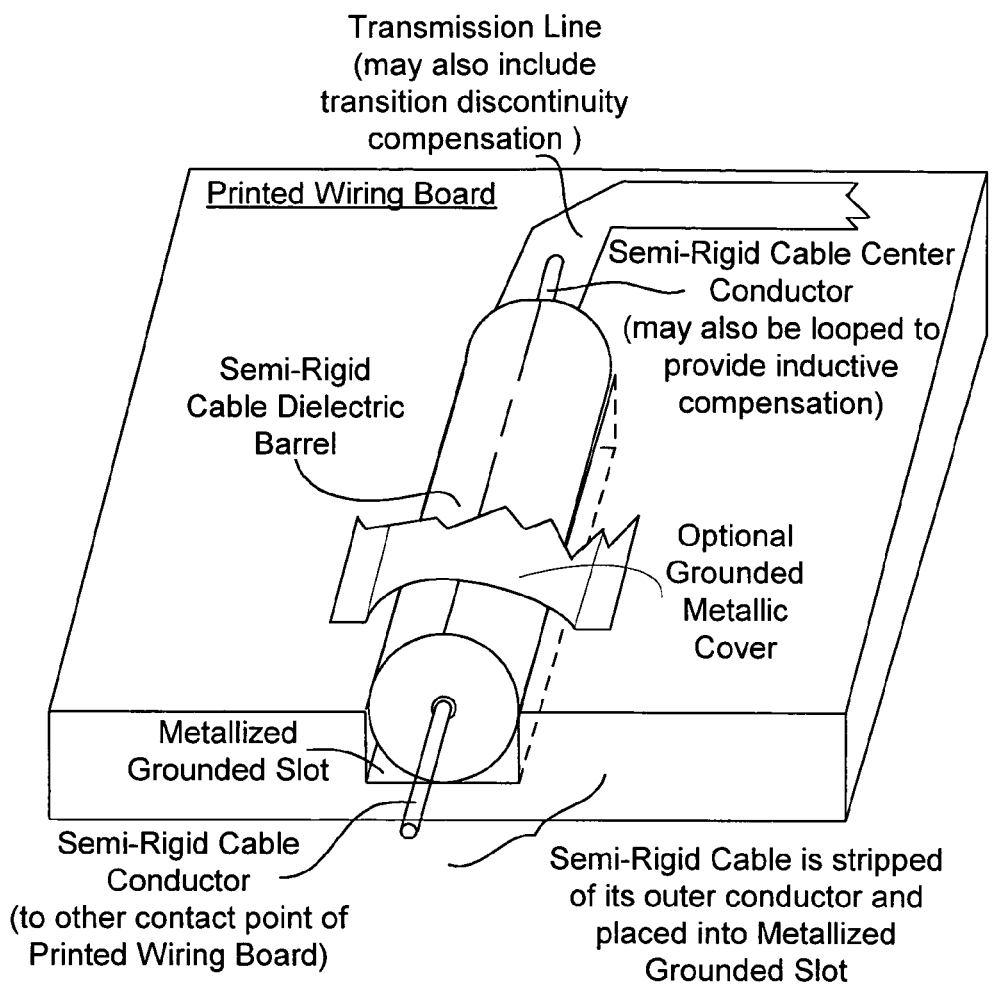
FIGS. 1a, 1b, and 1c illustrate a high frequency coax transmission line structure configured in accordance with an embodiment of the present invention.
Figure 1B:
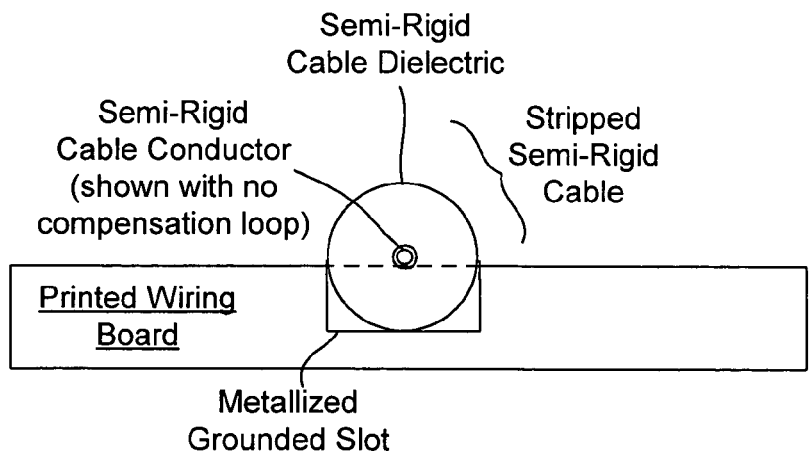
Figure 1C:
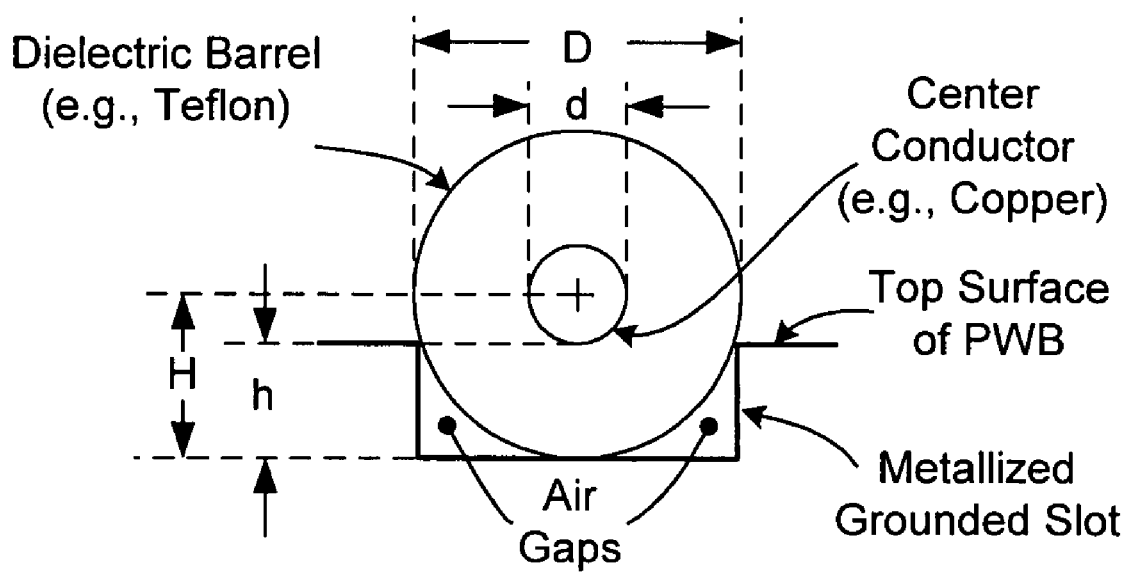

Note that the various features shown in FIGS. 1a, 1b, and 1c are not drawn to any particular scale. Rather, the figures are drawn to emphasize features and structure for purposes of explanation. The actual geometries and scale of the pertinent features and structure will be apparent in light of this disclosure

DETAILED DESCRIPTION OF THE INVENTION

It is often desirable to integrate high frequency (e.g., microwave) components onto a printed wiring board (PWB). However, and as previously explained, conventional printed coax transmission line structures which carry a signal from one point of the board to another have their shields connected to the ground plane, which causes a non-uniform current distribution and transition discontinuity. Discontinuity ultimately limits performance of a high frequency circuit, causing the likes of unacceptable VSWR and limited maximum operating frequency.

Embodiments of the present invention employ a stripped semi-rigid cable (no shield) in conjunction with a plated grounded slot formed in the printed wiring board to enable a low loss coaxial structure within the surface of the printed wiring board. The depth of the slot can be set so that the center conductor of the transmission line structure lays tangent on the printed transmission lines to which it couples, thereby enabling a simple transition at each end. The ends of the center conductor can be formed as necessary to make the tangent connection (e.g., the conductor is bent upwards when the slot depth is slightly deeper than what is necessary to make the center conductor naturally tangent on each corresponding connection point). Inductive compensation for transition discontinuity can also be provided at one or both connection points.

By removing the shield from a printed wiring board coaxial line and allowing the ground current to be carried by the plating in the printed wiring board, a more controlled signal transition can be made. In addition, this transmission line structure eliminates some manufacturing variability by controlling the shield structure through the more precise printed wiring board process (as opposed to the less precise component assembly process).

The stripped semi-rigid coax cable operates in conjunction with the grounded metallized slot to provide a desired line impedance. In particular, note that the rated impedance of the selected semi-rigid cable is different than the impedance of the resulting three-sided transmission line structure. For instance, semi-rigid cable UT-47-35 has a rated characteristic impedance of about 35 ohms. However, when it is stripped of its shield and mounted in a grounded metallized slot as described herein, the resulting transmission line structure has an impedance of about 47 to 53 ohms. A conductive cover can be molded or otherwise placed over the structure (so as to provide a fourth grounded side to the slot). In such embodiments, the characteristic impedance rating of the semi-rigid cable is about equal to the desired impedance for the overall transmission line structure.

PWB with High Frequency Coax Transmission Line

FIGS. 1a, 1b, and 1c illustrate a high frequency transmission line structure configured in accordance with one embodiment of the present invention. Note that a cross-section of the printed wiring board is taken across the structure, so as to better illustrate features of the embodiment shown. In the actual embodiment, the printed wiring board would extend beyond the metallized slot so that each end of the semi-rigid cable's conductor would lay tangent (or otherwise be formed to lay tangent) on a corresponding connection point. Further note that various other conventional elements and features of a printed wiring board are not shown, but may be included as necessary.

The printed wiring board can be configured in accordance with any one of a number of technologies, such as microstrip line or CPWG transmission line, and has sufficient thickness to accommodate the slot in which the stripped semi-rigid cable lays. Also, the board may include both high frequency components (e.g., microwave) and low frequency components (e.g., DC to several hundred kilohertz). Also, the board may be a double-sided single layer or multi-layer design. In a CPWG configuration, each CPWG making up the board could include, for example, a metal layer (e.g., copper), a dielectric layer (e.g., Rogers 4003), an adhesive layer (e.g., Rogers 4350), and a ground layer (e.g., copper).

Note that the number of layers comprising the printed wiring board, as well as the design and make-up of those layers, will vary depending on the particular application. Numerous configurations are possible, as will be apparent in light of this disclosure. Further note that phantom layers (those layers that are etched away during the fabrication process) are not shown. For instance, phantom layers of a CPWG might include copper layers between the dielectric and adhesive layers. Other such layers and sacrificial materials used to facilitate fabrication processes can be used here as well, depending on the particular printed wiring board design.

As can be seen in FIG. 1a, the transmission line structure couples a printed transmission line (e.g., microstrip line or CPWG transmission line) on the printed wiring board with some other printed connection point on the same surface of the printed wiring board (such as another printed transmission line or a printed connection pad for a component, for example). The transmission line structure includes a semi-rigid cable that has its outer conductor or shield stripped, so that only the cable's dielectric barrel and center conductor remain.

This stripped coax cable is then inserted into a metallized grounded slot, such that the dielectric barrel lays lengthwise in the slot, and contacts the three metallized grounded slot walls that run lengthwise with the dielectric barrel. The alignment and depth of the slot is such that the conductor of the cable protruding at each end of the slot lays tangent to or is slightly below the printed connection points to which it couples. A bonding material such as solder can be used to secure the center conductor to the connection points at each end of the slot. Note that these connections can be made without having to significantly manipulate the center conductor into position, due to the aligning qualities of the slot with respect to the connection points. Further note that, if desired, the stripped cable can be secured in the slot (before the conductor is soldered) with, for example, an epoxy or other suitable bonding material that is deposited in the slot and/or built up around the slot edges at a number of selected points.

Further note that a printed connection point can be formed so that there is no gap between that connection point and the end of the slot. This will allow the non-manipulated center conductor of the stripped semi-rigid cable to more efficiently transition to the printed connection point (by avoiding a dielectric gap therebetween). The walls defining the ends of the slot (i.e., the walls perpendicular to the metallized walls that run lengthwise with the stripped semi-rigid cable) are not metallized. This will allow the printed connection point to be formed up to the edge of the slot, thereby avoiding any gap between that connection point and the center conductor. The closely formed connection point will not short circuit with the grounded slot, because the end wall of the slot is not metallized or grounded.

Other techniques for improving the transition and manufacturability associated with the connections can be used here as well, depending on the particular connection type. For instance, the transition discontinuity between the center conductor of the stripped semi-rigid cable and a transmission line of similar width is relatively low. On the other hand, the transition discontinuity between the center conductor of the stripped semi-rigid cable and a relatively larger connection pad can be substantial, as the capacitance of the connection pad is significant. In such a cases, transition discontinuity compensation can be used to further mitigate discontinuity.

For example, a printed connection pad can be configured with a transmission line having an inductive compensation section as described in the previously incorporated U.S. application Ser. No. 10/903,566, filed Jul. 30, 2004, titled "High Frequency Via". In such an embodiment, the printed transmission line with the inductive section would couple the center conductor of the stripped semi-rigid cable to the pad. The inductive section can be configured to compensate for transition discontinuity associated with connecting the center conductor of the stripped semi-rigid cable to the larger capacitive pad.

Another technique to improve the transition between the center conductor and a connection point is to form an inductive compensation loop with the conductor, such as the inductive compensation loop described in the previously incorporated U.S. application Ser. No. 10/903,534, filed Jul. 30, 2004, titled "High Frequency Via with Stripped Semi-Rigid Cable". In such an embodiment, the corresponding printed connection point can be formed so that there is a gap between that connection point and the end of the slot. This will allow the center conductor of the stripped semi-rigid cable to be formed into the inductive compensation loop before it is laid tangent on the printed connection point, so as to compensate for transition discontinuity between that connection point and the semi-rigid cable. The tangent end portion of the loop can then be bonded to the connection point (e.g., with solder or other suitable bonding material). Note that the loop can be formed, for example, by bending the center conductor in the upward direction at the point where it exits the dielectric barrel, and then bending it again at its midsection and back down toward the board. The tangent end portion can then be formed.

The printed features of the board can be configured to comply with any processing standard for printed wiring boards, such as IPC specifications or other such standards that neglect microwave design considerations. Alternatively, the printed features can be configured with custom specifications, or in accordance with known microwave design rules.

The semi-rigid cable can be any such available, with the materials that make up the center conductor and dielectric barrel varying from one type to the next. In one embodiment, the center conductor is copper and the dielectric barrel is Teflon. The Teflon make-up of the dielectric barrel will allow the stripped cable to be more easily pressed or otherwise inserted into the metallized ground slot. The dimensions of the dielectric and conductor will vary from application to application, depending on factors such as the maximum operating frequency and the available slot depth (the thicker the printed wiring board, the deeper the metallized grounded slot can be, so as to accommodate a thicker dielectric barrel).

As previously explained, the stripped semi-rigid coax operates in conjunction with the grounded metallized slot to provide a desired impedance. Thus, the impedance of the resulting three-sided transmission line structure is essentially a combination of the stripped semi-rigid cable characteristics and the slot characteristics. FIG. 1c shows the particulars of one embodiment. Here, the semi-rigid cable is UT-47-35, which has a rated characteristic impedance of about 35 ohms. The dielectric barrel has a substantially round cross-section, which has a diameter of D. The center conductor also has a substantially round cross-section, which has a diameter of d. Note that dead center is the same for both the center conductor and the dielectric barrel.

The height of the metallized ground slot is h, which in this particular embodiment, allows the center conductor to lay tangent to or slightly below (down 10% from the naturally tangent position) the connection pads at either end of the slot. Thus, h is approximately equal to $((D/2)-(d/2))$. It will be appreciated that for slightly deeper slot depths, the center conductor could be bent in the upward direction to make the tangent connection. Likewise, the slot depth could be shallower, and the center conductor could be bent in the downward direction to make the tangent connection. Note, however, that in cases where the conductor is higher than the surface of connection point, it may be difficult to achieve an overall transmission line impedance as low as 50 ohms.

One particular embodiment is as follows:

D=0.037 (diameter of dielectric barrel);
d=0.016 (diameter of center conductor barrel);
$\epsilon$=2.0 (dielectric constant for Teflon dielectric barrel);
$\epsilon$=1.0 (dielectric constant for air gap); and
h=(slot height).

Given these parameters, then the following can be calculated:

$\epsilon_{avg}$=1.6 (dielectric constant for Teflon+air gaps);
H=0.0185 (distance from center of cable to bottom of slot); and
Zo=47.07 ohm (impedance of structure).

The average dielectric constant $\epsilon_{avg}$ is estimated at 1.6, as the area of the air about the barrel, including the air gaps, is slightly greater than the area of the Teflon dielectric barrel. If the areas of air and Teflon are substantially equal, then $\epsilon_{avg}$ would be about 1.5. The distance H from dead center of the center conductor to bottom of slot is one half of the diameter D of the dielectric barrel. The output impedance (Zo) can be calculated using the equation: $Zo=138\sqrt{\epsilon}\ [4H \tan h(\pi H/D)/(\pi/d)]$.

Thus, when the UT-47-35 semi-rigid cable is stripped of its shield and mounted in a grounded metallized slot as described herein, the resulting transmission line structure has an impedance in the range of 42 to 59 ohms, depending on the average dielectric constant, which typically will be about 1.6, thereby providing a nominal characteristic impedance of about 47 ohms.

As previously explained, a conductive cover (e.g., thin copper or aluminum sheet or other suitable conductive material) can be molded or otherwise placed over the structure, so as to provide a four sided transmission line structure. The cover could be connected to the ground plane, for example, with solder. In such cases, the characteristic impedance rating of the semi-rigid cable can be about equal to the desired impedance for the overall transmission line structure.

Other semi-rigid cable materials and dimensions will be apparent in light of this disclosure, and the present invention is not intended to be limited to any one such configuration. For example, metals other than copper can be used for the conductor, such as silver plated steel or aluminum. Likewise, other dielectric materials can be used, such as solid materials having low coefficient of friction, suitable insulating properties and chemical inertness.

A ground gap can be provided about printed connection pads and/or transmission lines. The width of the ground gap is the distance between the printed ground plane and the printed connection pads and/or transmission lines. It typically remains uniform about the printed connection pads, as well as along the printed transmission line. However, if desired, this gap can be increased about the connection pads at either end of the slot to minimize the pad capacitance. This will further help increase the bandwidth of the coax transmission line structure.

In any such embodiments, a stripped semi-rigid cable (no outer conductor) is placed in a plated grounded slot in the printed wiring board, thereby forming a three-sided (or four-sided if a cover is provided) high frequency coax transmission line structure within the surface of the printed wiring board. The structure has low insertion loss, integral ground continuity, low signal attenuation, and a simple transition at either end. If so desired, and as previously explained, various inductive compensation schemes can be added to mitigate transition discontinuity between that the structure's center conductor and the point to which the center conductor is connected.

Methodology

Figure 2:
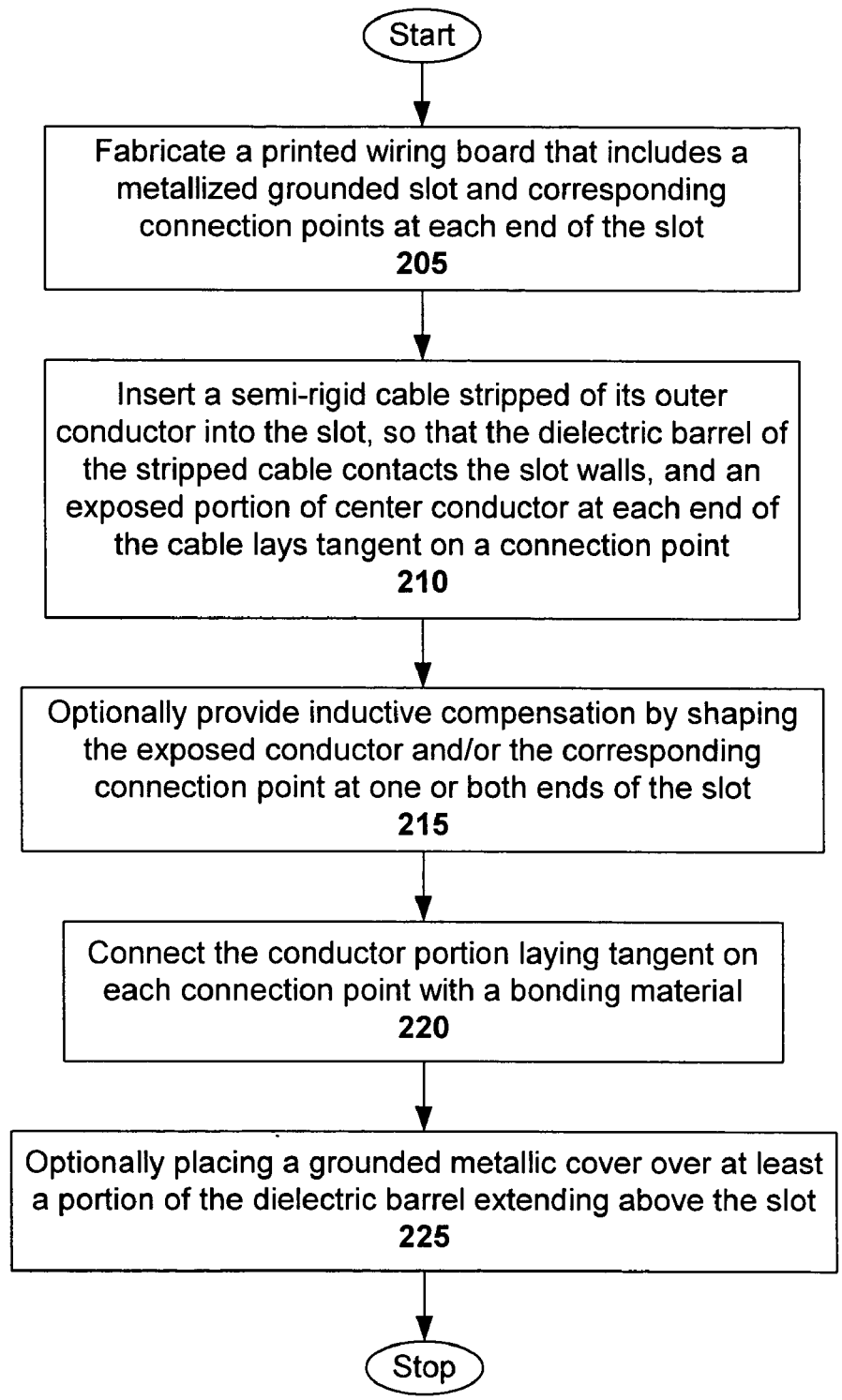
FIG. 2 illustrates a method for manufacturing a printed wiring board that includes a high frequency coax transmission line structure in accordance with another embodiment of the present invention.

FIG. 2 illustrates a method for manufacturing a printed wiring board that includes a high frequency coax transmission line structure in accordance with another embodiment of the present invention. This method can be used, for example, to fabricate the printed wiring board shown in FIGS. 1a, 1b, and 1c. Other board configurations can also be fabricated according to the method, as will be apparent in light of this disclosure.

The method includes fabricating 205 a printed wiring board that includes a metallized grounded slot and corresponding connection points at each end of the slot. The connection points can be, for example, printed transmission lines. Alternatively, the connection points can be pads configured in accordance with IPC standards (or other such standards that fail to accommodate the design needs of high frequency circuits). Alternatively, the connection points can be configured in accordance with a custom design, or some combination of the above.

The board may include any other standard or custom features as well (e.g., ground gaps about the connection pads). The board can be fabricated using conventional photolithography, mechanical drilling, or other known fabrication techniques. The board may be a multilayer or single layer board, where the transmission line structure couples a first connection point on the board to another connection point on the board. The metallized layers of the board can be, for example, copper. Other suitable metals can also be used here (e.g., aluminum, gold).

The method continues with inserting 210 a semi-rigid cable (e.g., UT-47-35) stripped of its outer conductor (shield) into the slot, so that the dielectric barrel of the stripped cable contacts the slot walls and an exposed portion of center conductor at each end of the cable lays tangent on a connection point. The conductor can be manipulated as necessary to make these tangent connections, depending on the slot depth and the desired compensation for transition discontinuity. As previously explained, using a semi-rigid cable that has a dielectric barrel with a low coefficient of friction will facilitate the insertion process of the semi-rigid cable into the slot. The stripped semi-rigid coax cable operates in conjunction with the grounded metallized slot to provide a desired line impedance (e.g., 47 to 53 ohms).

The method may further include the option of providing 215 inductive compensation by forming or otherwise shaping the exposed conductor and/or the corresponding connection point at one or both ends of the slot (as previously discussed). For instance, the one or both printed connection points can be formed with a transmission line having an inductive section configured to compensate for transition discontinuity between the center conductor and the corresponding connection point. Alternatively, or in addition to, the center conductor can be shaped into an inductive compensation loop at one or both ends, where each loop is configured to compensate for transition discontinuity between the center conductor and the corresponding connection point. Other compensation techniques and schemes can be used here as well in conjunction with the high frequency coax transmission line described herein.

The method continues with connecting 220 the conductor portion laying tangent on each connection point with a bonding material, such as solder. The thickness of the cable's conductor can be selected depending on the connection point geometry, so as to provide desired continuity. Generally stated, the thinner the conductor, the greater the inductance it will provide. In addition, the larger the connection point (e.g., pad or transmission line), the more capacitance it will provide. Greater capacitance requires greater inductance to properly absorb the transition discontinuity.

The method may further include placing 225 a grounded metallic cover (e.g., thin copper or aluminum sheet over at least a portion of the dielectric barrel extending above the slot. The cover can be molded or otherwise placed over the three-sided transmission line structure, so as to provide a four sided transmission line structure. In such embodiments, recall that the characteristic impedance rating of the semi-rigid cable can be about equal to the desired impedance for the overall transmission line structure. In one particular case, a copper cover is provided, and the stripped coax cable is UT-47-LL, which has a nominal characteristic impedance of about 50 ohms.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A printed wiring board that includes a high frequency coax transmission line structure, the board comprising:
   a slot formed in the board and having elongated side and bottom walls that are metallized and grounded, with a printed connection point at each end of the slot; and
   a semi-rigid cable stripped of its outer conductor and inserted into the slot, so that a dielectric barrel of the stripped cable contacts each of the elongated side and bottom walls, and an exposed portion of center conductor at each end of the cable lays tangent on a corresponding one of the connection points.

2. The board of claim 1 wherein the semi-rigid cable has an impedance that is less than impedance of the transmission line structure.

3. The board of claim 1 wherein one or both printed connection points include a transmission line having an inductive section configured to compensate for transition discontinuity between the center conductor and the corresponding connection point.

4. The board of claim 1 wherein the center conductor is shaped into an inductive compensation loop at one or both ends, where each loop is configured to compensate for transition discontinuity between the center conductor and the corresponding connection point.

5. The board of claim 1 wherein a grounded metallic cover is placed over at least a portion of the dielectric barrel extending above the slot.

6. The board of claim 1 wherein the slot has a depth such that the center conductor is bent upward to lay tangent on each corresponding connection point.

7. The board of claim 1 wherein the printed wiring board has top and bottom surfaces and includes multiple layers therebetween, and the slot of the high frequency coax transmission line structure passes through one or more of the layers.

8. The board of claim 1 wherein the board is further configured to compensate for transition discontinuity at each connection point.

9. A method for manufacturing a printed wiring board that includes a high frequency coax transmission line structure, the method comprising:
   fabricating a printed wiring board that includes a slot formed in the board and having elongated side and bottom walls that are metallized and grounded, with a printed connection point at each end of the slot;
   inserting a semi-rigid cable stripped of its outer conductor into the slot, so that a dielectric barrel of the stripped cable contacts each of the elongated side and bottom walls, and an exposed portion of center conductor at each end of the cable lays tangent on a corresponding one of the connection points.

10. The method of claim 9 wherein the semi-rigid cable has an impedance that is less than impedance of the transmission line structure.

11. The method of claim 9 further comprising:
    fabricating the printed wiring board so that one or both printed connection points includes a transmission line having an inductive section configured to compensate for transition discontinuity between the center conductor and the corresponding connection point.

12. The method of claim 9 further comprising:
    shaping the center conductor into an inductive compensation loop at one or both ends of the cable, where each loop is configured to compensate for transition discontinuity between the center conductor and the corresponding connection point.

13. The method of claim 9 further comprising:
placing a grounded metallic cover over at least a portion of the dielectric barrel extending above the slot.

14. The method of claim 9 wherein the slot has a depth such that the center conductor is bent upward to lay tangent on each corresponding connection point.

15. The method of claim 9 further comprising:
fabricating the printed wiring board to include compensation for transition discontinuity at one or both connection points.

16. A high frequency coax transmission line structure for a printed wiring board, the transmission line structure comprising:
a slot formed in a multilayer printed wiring board and having elongated side and bottom walls that are metallized and grounded, with a printed connection point at each end of the slot;
a semi-rigid cable stripped of its outer conductor and inserted into the slot, so that a dielectric barrel of the stripped cable contacts each of the elongated side and bottom walls, and an exposed portion of center conductor at each end of the cable lays tangent on a corresponding one of the connection points; and
inductive compensation for transition discontinuity at one or both connection points.

17. The transmission line structure of claim 16 wherein the slot has a depth such that the center conductor is bent upward to lay tangent on each corresponding connection point.

18. The transmission line structure of claim 16 wherein the semi-rigid cable has an impedance that is less than impedance of the transmission line structure.

19. The transmission line structure of claim 16 wherein the inductive compensation is provided at one or both printed connection points and includes a transmission line having an inductive section configured to compensate for transition discontinuity between the center conductor and the corresponding connection point.

20. The transmission line structure of claim 16 wherein the inductive compensation is provided by the center conductor, which is shaped into an inductive compensation loop at one or both ends, where each loop is configured to compensate for transition discontinuity between the center conductor and the corresponding connection point.

* * * * *